United States Patent
Pelaez

[19]

[11] Patent Number: 5,909,008
[45] Date of Patent: *Jun. 1, 1999

[54] MOUNTING MECHANISM FOR INSTRUMENTS HAVING FLANGES

[76] Inventor: Pedro R. Pelaez, 11960 NW. 87th Ave., Miami, Fla. 33016

[*] Notice: This patent issued on a continued prosecution application filed under 37 CFR 1.53(d), and is subject to the twenty year patent term provisions of 35 U.S.C. 154(a)(2).

[21] Appl. No.: 08/592,932
[22] Filed: Jan. 29, 1996

Related U.S. Application Data

[63] Continuation of application No. 08/592,932, Jan. 29, 1996, abandoned.

[51] Int. Cl.[6] .................................................. H01B 17/00
[52] U.S. Cl. .................................. 174/138 G; 248/27.1; 248/346.05; 361/659
[58] Field of Search ........................... 174/138 F, 138 G, 174/67, 135; 248/27.1, 27.3, 346.5; 24/590; 211/86; 361/659, 664, 666, 667

[56] References Cited

U.S. PATENT DOCUMENTS

| 789,735 | 5/1905 | Hochhausen. | |
|---|---|---|---|
| 1,144,852 | 6/1915 | Kopeczky | 24/109 |
| 2,084,717 | 6/1937 | Wiley | 52/716.7 |
| 3,026,072 | 3/1962 | Hughes | 244/148 |
| 4,457,672 | 7/1984 | Ogura et al. | 417/360 |
| 4,596,504 | 6/1986 | Gunther | 411/555 |
| 5,219,135 | 6/1993 | Scott | 248/27.1 |

Primary Examiner—Kristine Kincaid
Assistant Examiner—Kamand Cuneo
Attorney, Agent, or Firm—J. Sanchelima

[57] ABSTRACT

A mechanism for removably mounting instruments with a cylindrical outer case to a flat panel over an opening with a peripheral wall extending perpendicularly from the rear side of the panel and two or more gripping assemblies mounted adjacent to the wall. Outwardly extending flange members mounted on the outer case at one end of the instrument are cooperatively and removably engaged within the gripping assemblies. The gripping assemblies in an alternate embodiment are removably mounted through slots in the panel. A user can mount and unmount the instruments from the rear without requiring the use of any tools.

8 Claims, 1 Drawing Sheet

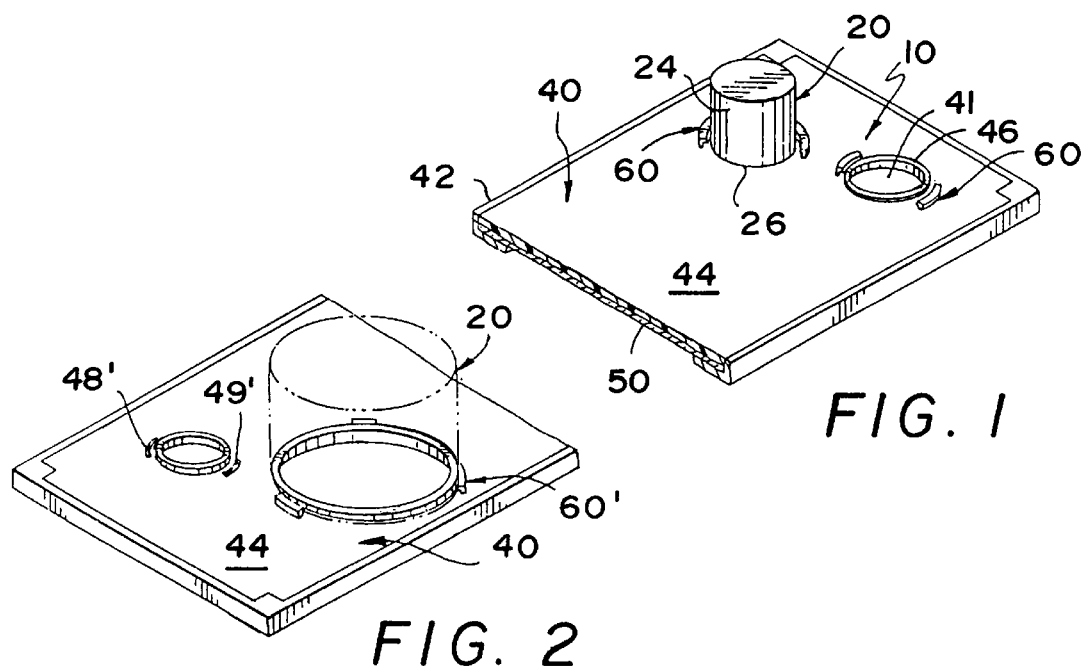
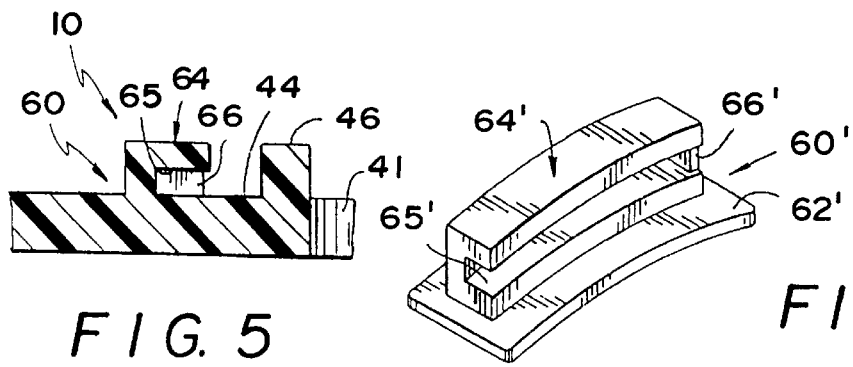
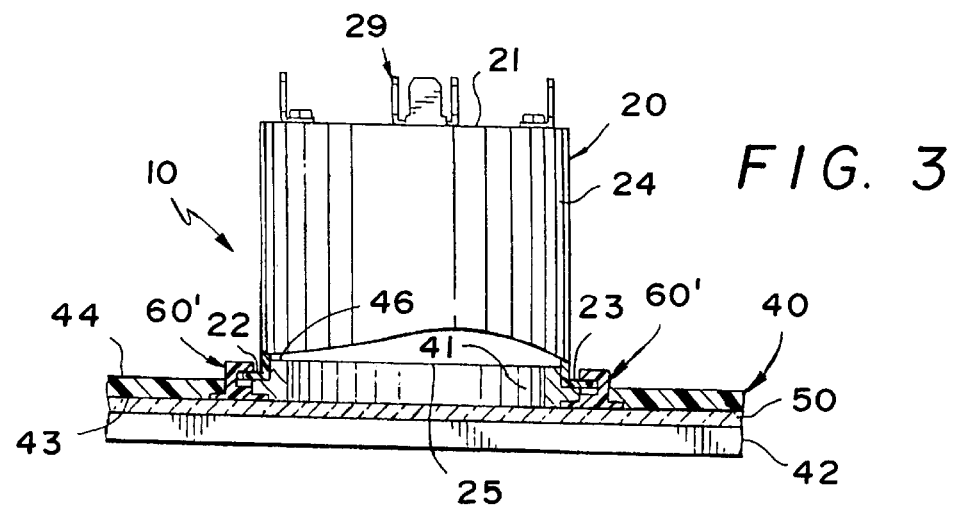

MOUNTING MECHANISM FOR INSTRUMENTS HAVING FLANGES

This application is a continuation of application Ser. No. 08/592,932, filed Jan. 29, 1996, now abandoned.

BACKGROUND OF THE INVENTION

1. Field of the Invention

The present invention relates to a mechanism for mounting instruments, such as meter gauges, to a panel. And more particularly, to the type that removably flush mounts the instruments from the rear side of a panel with corresponding openings, such as a control panel.

2. Description of the Related Art

Applicant believes that the closest reference corresponds to U.S. Pat. No. 789,735 issued to H. T. Hochhausen in 1905. However, it differs from the present invention because flanges D and E and projections F and G of socket A that hold the latter to a plate with projections F and G. This mechanism does not allow for a flush mount on a panel. Also, the patented lamp holder has crevices and openings that make instruments susceptible to the elements.

Other patents describing the closest subject matter provide for a number of more or less complicated features that fail to solve the problem in an efficient and economical way. None of these patents suggest the novel features of the present invention.

SUMMARY OF THE INVENTION

It is one of the main objects of the present invention to provide a mechanism for removably mounting instruments on the rear side of a panel and flush with the front side of the panel. For panel assemblies that include a protecting glass, such as control panel assemblies, the instruments can be mounted and unmounted without removing the protecting glass in the front.

It is another object of this invention to provide a mounting mechanism that can be easily installed on a control panel assembly without using tools.

It is another object of this invention to provide a mounting mechanism that permits the mounting of instruments in position and removed from the panel by a user with a minimum of effort and time.

It is yet another object of this invention to provide such a mechanism that is inexpensive to manufacture and maintain while retaining its effectiveness.

Further objects of the invention will be brought out in the following part of the specification, wherein detailed description is for the purpose of fully disclosing the invention without placing limitations thereon.

BRIEF DESCRIPTION OF THE DRAWINGS

With the above and other related objects in view, the invention consists in the details of construction and combination of parts as will be more fully understood from the following description, when read in conjunction with the accompanying drawings in which:

FIG. 1 represents an isometric view of a portion of a control panel incorporating the present invention with an instrument mounted on the rear side of the control panel having built-in gripping assemblies.

FIG. 2 is an isometric view of a portion of a control panel incorporating an alternate embodiment for the present invention with the instrument shown in phantom, using removable gripping assemblies.

FIG. 3 is an elevational partial cross section of a panel with a meter gauge mounted to the rear side of the panel and held in place with removable gripping assemblies.

FIG. 4 is an isometric view of a removable gripping assembly used in the alternate embodiment of the present invention.

FIG. 5 is a partial elevational cross section of the built-in gripping assembly shown in FIG. 1.

DETAILED DESCRIPTION OF THE PREFERRED EMBODIMENT

Referring now to the drawings, where the present invention is generally referred to with numeral 10, it can be observed that it basically includes flange members 22 and 23 mounted to the outer surface of meter gauge assembly 20 and gripping assembly 60 built-in on the rear end of flat panel assembly 40. An alternate embodiment disclosed below shows a mechanism that uses removable gripping assembly 60', as shown in FIGS. 2; 3 and 4. The alternate embodiment is easier to incorporate in production since the preferred embodiment requires special molding for manufacturing flat panel assembly 40.

As shown in FIGS. 1; 2 and 3, meter gauge assembly 20 includes cylindrical outer case 24, rear end 21 with electric connections 29 and front end 25. Meter gauge assembly 20, in the preferred embodiment, includes outwardly extending flange members 22 and 23 mounted on the outer surface of outer case 24, near front edge 26. Flange members 22 and 23 extend outwardly and are spaced from each other a predetermined distance. The number of flange members depends on the peripheral linear dimension of meter gauge assembly 20. In FIG. 2, for instance, meter gauge assembly 20 has three flange members mounted near edge 26. At least two flange members are required.

Flat panel assembly 40, in the preferred embodiment, includes front surface 43, rear surface 44 and openings 41 over which meter gauge assemblies 20 are installed. Inwardly extending wall 46 is positioned peripherally adjacent to opening 41. Inwardly extending wall 46 cooperatively engages the inner surface of outer case 24 and is enclosed by outer case 24, thereby preventing any movement along the plane of rear surface 44. Panel assembly 40 is mounted within frame 42 that also holds protective cover 50. Protective cover 50 can be also made out of a transparent plastic material.

Gripping assembly 60 basically includes gripping member 64 built-in on rear surface 44, as best seen in FIG. 5. Gripping member 64 has an inverted "L" shape with channel 65 extending along gripping member 64 except at one end where stopping wall 66 is. In this manner, meter gauge assembly 20 can be easily mounted in position or removed from panel assembly 40 without the use of tools. When a user desires to install meter gauge assembly 20, the latter is brought against rear surface 44 and over wall 46. Then, a user rotates assembly 20 until flange assemblies 22 and 23 firmly engage to gripping members 64 with assemblies 22 and 23 sliding within channel 65. The rotational movement, applied by a user, ends when tab assemblies 22 and 23 meet stopping wall 66 of gripping member 64, as best seen in FIGS. 1 and 5. To unmount assembly 20, a user rotates it in the opposite direction until flange members 22 and 23 completely clear gripping member 64.

Removable gripping assemblies 60', as shown in FIGS. 3 and 4, include base member 62' with gripping member 64' rigidly mounted thereon. Gripping assemblies 60' are removably mounted through slots 48' and 49' located in panel assembly 40, as shown in FIG. 2. Gripping member 64' is inserted from front surface 43 (before placing protective cover 50) and extends sufficiently over rear surface 44 permitting it to snugly receive flange members 22 and 23 within channel 65. Slots 48' and 49' are less costly to mold or punch than forming assemblies 60 on a panel.

As illustrated in FIG. 3, protective glass member 50 is placed against front surface 43 to cover and protect electronic instruments from the elements and damage. In a conventional panel with instruments, a user typically has to remove protective cover 50 before he or she can install or remove an instrument. With the present invention, a user works from the rear of the panel without requiring that the glass member be removed.

The foregoing description conveys the best understanding of the objectives and advantages of the present invention. Different embodiments may be made of the inventive concept of this invention. It is to be understood that all matter disclosed herein is to be interpreted merely as illustrative, and not in a limiting sense.

What is claimed is:

1. In an assembly having an instrument and a flat panel having front and rear surfaces, said panel having at least one opening for mounting at least one instrument thereon and said instrument having a cylindrical outer case with two ends and an edge at one of said ends and inner and outer surfaces, the improvement comprising at least two outwardly extending flange members mounted on said outer surface of said instrument, and said opening including an inwardly extending peripheral wall extending around said opening for cooperatively abuttingly engaging said inner surface of said cylindrical outer case and further including at least two gripping means for holding each of said outwardly extending flanges so that said edge is abutting against said rear surface.

2. The improvement set forth in claim 1 wherein each of said gripping means includes an inverted "L" shape member that with said rear surface, in combination, define a channel for receiving each of said flange members.

3. The improvement set forth in claim 2 wherein each of said gripping means further includes a stop wall defining an end of said channel.

4. The improvement set forth in claim 3 further including a protective cover and frame means for holding said protective cover against the front surface of said panel.

5. In an assembly having an instrument and a flat panel having front and rear surfaces said panel having at least one opening for mounting at least one instrument thereon and said instrument having a cylindrical outer case with two ends and an edge at one of said ends, inner and outer surfaces, the improvement comprising at least two outwardly extending flange members mounted on said outer surface, and said opening including an inwardly extending peripheral wall extending around said opening for cooperatively abuttingly engaging said inner surface of said cylindrical outer case, said panel including at least two slots positioned adjacent to said opening, and further including at least two gripping means for holding each of said outwardly extending flange members, said gripping means being mounted to said panel through said slots so that said edge is abutting against said rear surface.

6. The improvement set forth in claim 5 wherein each of said gripping means includes an inverted "L" shape member that with said rear surface, in combination, define a channel for receiving one of said flange members.

7. The improvement set forth in claim 6 wherein each of said gripping means further includes a stop wall defining an end of said channel.

8. The improvement set forth in claim 7 further including a protective cover and frame means for holding said protective cover against the front surface of said panel.

* * * * *